(12) United States Patent
Lugli et al.

(10) Patent No.: US 8,988,261 B2
(45) Date of Patent: Mar. 24, 2015

(54) DELTA-SIGMA D/A CONVERTER

(75) Inventors: Roberto Lugli, Segrate (IT); Michael Korn, Marktoberdorf (DE); Alfred Zotz, Aitrang (DE); Stephan Damith, Nesselwang (DE)

(73) Assignee: Endress + Hauser Wetzer GmbH + Co. KG, Nesselwang (DE)

( * ) Notice: Subject to any disclaimer, the term of this patent is extended or adjusted under 35 U.S.C. 154(b) by 8 days.

(21) Appl. No.: 13/884,639

(22) PCT Filed: Oct. 20, 2011

(86) PCT No.: PCT/EP2011/068369
§ 371 (c)(1),
(2), (4) Date: May 10, 2013

(87) PCT Pub. No.: WO2012/062552
PCT Pub. Date: May 18, 2012

(65) Prior Publication Data
US 2013/0234872 A1 Sep. 12, 2013

(30) Foreign Application Priority Data
Nov. 12, 2010 (DE) .......................... 10 2010 043 842

(51) Int. Cl.
*H03M 1/82* (2006.01)
*H03M 3/02* (2006.01)
(Continued)

(52) U.S. Cl.
CPC ................ *H03M 3/02* (2013.01); *H03M 3/358* (2013.01); *H03M 7/3028* (2013.01); *H03M 3/506* (2013.01)
USPC ............................ 341/152; 341/143; 341/144

(58) Field of Classification Search
USPC .................................... 341/143, 144, 145, 152
See application file for complete search history.

(56) References Cited

U.S. PATENT DOCUMENTS

| 5,307,064 | A | * | 4/1994 | Kudoh ......................... 341/144 |
| 5,424,739 | A | | 6/1995 | Norsworthy et al. |
| 6,317,067 | B1 | | 11/2001 | Mohindra |

(Continued)

FOREIGN PATENT DOCUMENTS

| DE | 694 28 869 T2 | 7/2002 |
| WO | 2004/051860 A2 | 6/2004 |
| WO | 2004/095704 A2 | 11/2004 |

OTHER PUBLICATIONS

German Search Report dated Sep. 5, 2011, issued in Application No. 10 2010 043 842.1, in Munich, Germany.

(Continued)

*Primary Examiner* — Brian Young
(74) *Attorney, Agent, or Firm* — Bacon & Thomas, PLLC

(57) ABSTRACT

A delta-sigma D/A converter, by which a digital valued, input signal is convertible into a binary, clock signal time discrete, output signal. By forming an average value of the output signal over a number of clock signal cycles, an analog value of the input signal can be displayed. The delta-sigma D/A converter is embodied in such a manner that, in use, it provides the output signal by serial arrangement of signal patterns of a set of signal patterns, wherein the signal patterns of the set are, in each case, binary, clock signal time discrete and extend over a signal pattern cycles total of a plurality of clock cycles. At least two signal patterns of the set have mutually different signal pattern average values, which are formed over the respective signal pattern cycles total, and all signal patterns of the set have, in each case, essentially the same number, especially exactly the same number, of edges.

14 Claims, 4 Drawing Sheets

(51) Int. Cl.
*H03M 3/00* (2006.01)
*H03M 7/30* (2006.01)

(56) References Cited

U.S. PATENT DOCUMENTS

| | | | |
|---|---|---|---|
| 7,205,920 B2 * | 4/2007 | Morrow et al. | 341/144 |
| 7,345,608 B2 * | 3/2008 | Tu et al. | 341/143 |
| 7,719,369 B2 * | 5/2010 | Kamath et al. | 331/34 |
| 2008/0180293 A1 | 7/2008 | Kitahira et al. | |

OTHER PUBLICATIONS

International Preliminary Report on Patentability dated May 16, 2012, issued in Application No. PCT/EP2011/068369, in Rijswijk, the Netherlands.

International Preliminary Report on Patentability dated May 23, 2013, issued in Application No. PCT/EP2011/068369, in Geneva, Switzerland.

* cited by examiner

DELTA-SIGMA D/A CONVERTER

TECHNICAL FIELD

The present invention relates to a delta-sigma digital/analog converter (delta-sigma D/A converter), by which a digital valued, input signal is convertible into a binary, clock signal time discrete, output signal. In such case, the value of the input signal can be displayed in analog form by an average value of the output signal formed over a number of clock cycles.

BACKGROUND DISCUSSION

Delta-sigma D/A converters have at least one delta-sigma modulator of first or higher order. Delta-sigma modulators are basically known from the state of the art. Delta-sigma modulators process a (digital valued or analog) input signal and convert such into a binary, clock signal time discrete, output signal, wherein the output signal always enters into the processing of the input signal. The clock rate, with which a delta-sigma modulator is operated and with which the output signal is output, is, as a rule, markedly greater than the data rate of the input signal and also greater than in the case of many other D/A converters (principle of over-sampling). The output signal can assume during each clock cycle exactly one of two values, which are referred to as "1" and "0". Accordingly, the output signal is formed by a stream of "1"s and "0"s, wherein the data rate, with which these values are output corresponds to the clock rate of the delta-sigma modulator. The output signal of a delta-sigma modulator is frequently also referred to as a bit stream. The average value of the output signal of the delta-sigma modulator corresponds to the value of the input signal.

Delta-sigma modulators are frequently applied in high resolution D/A converters, since these, due to the principle of over-sampling, provide a high signal to noise ratio. Furthermore, delta-sigma modulators are relatively simply implementable in an ASIC (application specific integrated circuit), a CPLD (complex programmable logic device), and/or in an FPGA (field programmable gate array). In the case of use in a D/A converter, the input signal of the delta-sigma modulator is digital valued. The output signal of the delta-sigma modulator, which, as a rule, is formed by a bit stream, is filtered by an analog, low-pass filter, so that an analog signal is obtained, whose value corresponds to the digital input value of the input signal.

Depending on the input value of the (digital valued) input signal to be displayed, in a delta-sigma D/A converter, the output signal of the delta-sigma modulator has an different relationship of "1"s and "0"s. In this way, also the frequency, with which a change between "1"s and "0"s occurs, depends on the input value to be displayed. This will now be explained with reference to FIGS. 1a-1c, in which, in each case, the output signal OS of a delta-sigma modulator is plotted versus time t. The clock cycles are indicated on the time axis. For example, the minimum input value presentable in the output signal of the delta-sigma modulator is represented by a series of "0"s, as shown in FIG. 1a. The maximum presentable input value is represented by a series of "1"s, as shown in FIG. 1b. In both cases, the output signal has a frequency of 0 Hz (minimum frequency). The maximum frequency in the output signal is reached, when, in the output signal of the delta-sigma modulator, the "0"s and the "1"s alternate with each clock signal, as such is presented in FIG. 1c. Depending on the input value to be represented, thus, the frequency of the output signal varies in this relatively large frequency range.

Analog low-pass filters are, as a rule, designed for a relatively narrow frequency range, in which it then achieves a very good filter characteristic curve. The larger the separation of the actual frequency from this optimal frequency range, the poorer, as a rule, is the filter characteristic curve. Since the frequency of the output signal of the delta-sigma modulator can vary over a broad region, it was necessary previously in delta-sigma D/A converters that relatively complex, analog, low-pass filters be applied for filtering the output signal. A further problem is that in the output signal the edges (rising and falling edges) extend, as a rule, not so ideally at right angles to the abscissa, this being illustrated in FIG. 1c. Rather, there arises in the region of the edges (compare rising edges 2 and falling edges 3 in FIGS. 1c and 1d) frequently a distortion, this being illustrated, by way of example, in FIG. 1d. Due to the distortion, the signal deviates in the region of the edges 2, 3 from an ideal rectangular signal. Frequently, the output signal is transmitted through a galvanic isolation, before it is fed to the analog, low-pass filter. This leads, as a rule, to an additional distortion of the edges 2, 3. The distortion of the edges 2, 3 leads to an error. For example, an analog low-pass filtering occurs, as a rule, in such a way that the area under the signal to be filtered is averaged over time. Due to the distortion, there arises in the case of this averaging, respectively low-pass filtering, a deviation compared with an ideal, rectangular signal. Additionally problematic is that this error varies with the number of edges. Since the frequency of the output signal of the delta-sigma modulator and therewith the number the edges (per unit time) can vary over a large range, the error occurring from the distortion cannot be simply corrected by a constant offset.

This problem is present especially in cases, in which a digital valued, measured value or a digitally valued, actuating value is to be converted into an analog voltage or electrical current. Especially, in the case of this application, an as exact as possible conversion with high linearity is desired.

On the basis of these considerations, an object of the present invention is to provide a delta-sigma D/A converter, which enables, over the range of the input value to be displayed for the input signal, an as exact as possible digital to analog conversion, without that complex (analog) filtering must be applied and/or complex error correction performed.

SUMMARY OF THE INVENTION

The object is achieved by a delta-sigma D/A converter by which a digital valued, input signal is convertible into a binary, clock signal time discrete, output signal. Then, by forming an average value of the output signal over a number of clock signal cycles, an analog value (subsequently referred to as the "input value") of the input signal can be displayed. The delta-sigma D/A converter is embodied in such a manner that, in use, it provides the output signal by serial arrangement of signal patterns of a set of signal patterns, wherein the signal patterns of the set are, in each case, binary, clock signal time discrete and extend over a signal pattern cycles total of a plurality of clock cycles. At least two signal patterns of the set have mutually different, signal pattern average values, which are formed over the respective signal pattern cycles total, and all signal patterns of the set have, in each case, essentially the same number, especially exactly the same number, of edges.

The delta-sigma D/A converter of the invention furthermore utilizes the advantages of delta-sigma conversion, which include, among others, a high signal to noise ratio and simple implementability. Especially, the provided output signal is furthermore embodied in such a manner that its average value corresponds to the value (respectively, input value) of the digital valued, input signal. Since the output signal is composed of signal patterns, which have, in each case, essentially the same number of edges, the frequency range of the output signal is significantly reduced. Especially, the output signal has, independently of which input value is presented, essentially a constant frequency and essentially a constant number of edges over time. In this way, a less complex lowpass filtering of the output signal can be used for providing the analog signal and simultaneously an excellent filter characteristic curve can be achieved. Furthermore, correction of error brought about by distortion of the edges is facilitated, since the error is essentially constant and independent of the presented input value. The error correction can, thus, occur simply by an offset. Furthermore, in reference to some applications, such as, for example, in the case of application of the delta-sigma D/A converter for adjusting an electrical current value (e.g. according to the 4-20 mA standard), in order to provide therewith a measured value or an actuating value, it is advantageous that, according to the present invention, the output signal cannot decrease completely to an output value of zero.

The terminology, delta-sigma D/A converter, means a D/A converter, in which a delta-sigma modulation is performable. Especially, such a delta-sigma D/A converter includes at least one delta-sigma modulator (of first or higher order). The delta-sigma modulator can, in such case, be formed in different ways.

The terminology, a "binary" output signal, means an output signal, which is discretely valued and which, at a given point in time, can assume always only exactly one of two possible binary values. The binary values are referred to here as "1" and as "0", wherein basically alternative references, such as "high" and "low", are also possible. The binary values are represented in the output signal, for example, by two different voltage values, wherein, alternatively two different electrical current values, etc., are also possible. The terminology "clock signal time discrete" means that the output signal, over a cycle length of the clock signal, always assumes a constant value (which, here, corresponds to one of the two binary values). The above explained properties of the "binary, clock signal time discrete, output signal" correspond to an ideal signal. There are, however, also signal curves, which, due to distortions, defects, etc., deviate somewhat from this ideal signal. The terminology "displayed in analog form" means that the average value of the output signal is correlated with the (digital) input value of the input signal via a predetermined relationship. In such case, the average value of the output signal need not absolutely, exactly correspond to the input value of the input signal. For example, it can also be proportional to such and/or be shifted from such by an offset.

Since the output signal is formed by serial arrangement of the signal patterns, the signal patterns of the set of signal patterns have, in each case, the same binary values and the same clock signal as the above explained output signal. The signal pattern cycles total of the signal pattern amounts preferably to at least three clock cycles. The "number of edges" refers to the total number of edges of the relevant signal pattern, independently of whether rising or falling edges are involved. Which number of edges is still considered "essentially equal" depends on the signal pattern cycles total of the respective signal pattern and the error still considered as tolerable. The best result is achieved when all signal patterns of the set (preferably, in each case, having the same signal pattern cycles total) have exactly the same number of edges. Preferably, there are, in such case, exactly the same number of rising and falling edges within a signal pattern. In the case of certain applications and especially in the case of large signal pattern cycles total, however, small deviations in the number of edges can still lead to a good result.

The signal pattern average value determines, in such case, the weighting, which the particular signal pattern has in the output signal. Thus, the different signal patterns must be so serially arranged that, through the time averaged value of the obtained output signal, the value (respectively, input value) of the input signal is displayable in analog form. The set of signal patterns can be formed from exactly two signal patterns with different signal pattern average values or even from more than two signal patterns with, in each case, different signal pattern average values. In the latter case, the output value range to be represented by the output signal can be divided into a number of portions. In such case, output values within a portion (which does not correspond exactly to a signal pattern average value) can, in each case, be represented by modulation of two signal patterns, in the case of which the one signal pattern has a higher and the other signal pattern a lower, signal pattern average value than the output value to be represented. Especially, the representation can occur by modulation of the two signal patterns, whose signal pattern average values lie closest to the output value to be displayed.

In the present invention, it can also be provided that signal patterns have a different number of rising and falling edges. Especially, when the error caused by a distortion in the case of a rising edge is essentially the same as in the case of a falling edge, good results can be achieved. The serial arrangement of signal patterns, which have within a signal pattern a different number of rising and falling edges, can, however, require additional effort, since, in each case, the beginning of a following signal pattern must, in each case, correspond to the end of the preceding signal pattern. In a further development, all signal patterns of the set have, in each case, the same number of rising edges and, in each case, this same number of falling edges. This means, that each signal pattern ends with the binary value, with which it begins. In this way, the effort for selection of the signal patterns to be serially arranged is reduced, since these basically can be arranged serially in any combination. The number of rising and falling edges can, in such case, per signal pattern, in each case, be only one; it can, however, also be greater than one.

In a further development, all signal patterns of the set have, in each case, the same signal pattern cycles total. In this way, the delta-sigma modulator can be operated with a constant modulator clock frequency. The modulator clock frequency corresponds, in such case, especially to the rate, with which the individual signal patterns are output in the output signal. In a further development, all signal patterns of the set have, in each case, exactly one rising and exactly one falling edge. In this way, in especially simple manner, many (wherein the maximum possible number depends on the signal pattern cycles total) signal patterns can be provided with, in each case, different signal pattern average values.

In part, in the case of predetermined signal pattern cycles total and in the case of a certain signal pattern average value, different options exist for the actual shaping of the signal pattern. This is also the case for the above described further development, in the case of which each signal pattern has exactly one rising and exactly one falling edge, at least for some signal pattern average values. The provision of different signal patterns with the same signal pattern average values requires, however, an additional effort for managing and selecting the signal patterns. In a further development, it is accordingly provided that all signal patterns of the set have, in each case, different signal pattern average values.

In a further development, all signal patterns of the set have a signal pattern cycles total of m clock cycles, the set includes m−1 different signal patterns with, in each case, different signal pattern average values, the signal pattern with the lowest signal pattern average value assumes for exactly one clock cycle long the high value of the two available binary values and the remaining m−1 clock signals the low binary value, and each signal pattern of the set assumes, relative to the signal pattern with the next lower signal pattern average value, for exactly one clock signal longer the high binary value. In this further development, in simple manner, in the case of a predetermined signal pattern cycles total, an as high as possible number of signal patterns can be provided with, in each case, different signal pattern average value. Alternatively, however, also a set of signal patterns can be provided, in the case of which each signal pattern assumes relative to the signal pattern with the next lower signal pattern average value exactly 2, 3, 4, . . . or clock cycles longer the high binary value, so that a larger separation between the signal pattern average values of the individual signal patterns is implemented.

In the case of the delta-sigma D/A converter, since a digital valued, input signal is processed, the circuit for producing the output signal is preferably embodied digitally. In a further development, the delta-sigma D/A converter includes a digital delta-sigma modulator, by which at least one part of the digital valued, input signal is modulatable. Especially, it can be provided that the entire, digital valued, input signal is modulated by the delta-sigma modulator. Alternatively, however, also, as below explained in reference to a further development, a part of the digital valued, input signal can be diverted and only the remaining part of the digital valued, input signal fed to the delta-sigma modulator. In a further development, the digital delta-sigma modulator is formed by a digital delta-sigma modulator of first order.

In a further development, the delta-sigma D/A converter is embodied in such a manner that, from the digital valued, input signal, a predetermined number of places of the highest valued bit locations is divertable and the bit locations remaining are suppliable to the digital delta-sigma modulator for producing a binary, modulator clock signal time discrete, modulator output signal. In such case, at least one, but preferably a number of bit locations is/are diverted, wherein the number of diverted bit locations during operation of the delta-sigma D/A converter remains, as a rule, constant. The modulator clock signal deviates, in such case, especially from the clock signal explained above in reference to the signal pattern. Especially, the modulator clock frequency corresponds to only a fraction of the clock frequency. Especially, the modulator clock frequency corresponds to a signal pattern clock frequency, with which the individual signal patterns are output in the output signal.

In a further development, an association is defined, by which there is associated with each signal pattern of the set, in each case, an occupation (corresponding to the signal pattern average value of the particular signal pattern) of the divertable, highest valued bit location(s) of the digital valued, input signal. Furthermore, the delta-sigma D/A converter includes a signal pattern generator, by which, as a function of the respective occupations of the diverted, highest valued bit location(s) corresponding to the association, the associated signal pattern is determinable, and this determined signal pattern can be output by the signal pattern generator as lower modulation variable for forming the output signal. The association is, in such case, especially precise and so defines that the possible, representable input value range of the digital valued, input signal is divided as uniformly as possible among the available signal pattern average values of the set of signal patterns. Since the diverted, highest valued bit location(s) already determine the order of magnitude of the input value, the association can occur simply based on these diverted, highest valued, bit locations. Especially, it can be provided that the signal pattern associated with a certain occupation of the divertable, highest valued bit location(s) has a signal pattern average value, which corresponds exactly to the value of the certain occupation, wherein an occupation with "0"s is assumed, in each case, for the remaining bit locations of the input signal. Alternatively, it can, however, also be provided that the signal pattern average value is proportional to this input value (preferably with a proportionality factor that is uniform for all signal patterns of the set) and/or is shifted by an offset relative thereto. The (known) relationship between the respective occupations of the divertable, highest valued bit locations of the input signal and the associated signal pattern average values, by which also the relationship of an input value of the digital valued, input signal and an average value of the output signal formed over a number of clock signal cycles is determined, must only be taken into consideration in the case of the evaluation and/or additional processing of the output signal provided by the delta-sigma D/A converter. In given cases, it can also be provided that the digital valued, input signal is, first of all, processed, especially shifted by an offset and/or scaled with a scaling factor, in order to match it optimally to the region covered by the signal patterns of the set. Such signal processing of the input signal (i.e. before delivery of the same to the delta-sigma D/A converter) and/or of the output signal (i.e. after providing of the same by the delta-sigma D/A converter) can be done simply and can be correspondingly taken into consideration in the case of further processing of the respective signal (due to the knowledge of the changes which were undertaken).

The determining of the, in each case, associated signal pattern as a function of the occupation of the diverted, highest valued bit location(s) can be performed in the signal pattern generator especially with the assistance of a lookup table. In a lookup table, it is possible, in simple manner, to store the association between each possible occupation of the divertable, highest valued bit location(s) and the, in each case, corresponding signal pattern. In this way, the determining can be performed rapidly and simply in the signal pattern generator. In a further development, the signal pattern with the next higher signal pattern average value in comparison to the signal pattern average value of the signal pattern determined as lower modulation variable is issuable by the signal pattern generator as upper modulation variable for forming the output signal. Such a second modulation variable is only not required when the input value of the input signal is displayable exactly by the signal pattern average value of the signal pattern determined as lower modulation variable. If the input value is, in contrast, somewhat larger, this being especially the case when the bit locations of the input signal remaining after the diverting have an occupation deviating from all "0"s, then also the upper modulation variable is required for representing the input signal.

The relationship, according to which the lower modulation variable and the upper modulation variable occur in the output signal, is especially determined by the bit locations remaining after the diverting. In a further development, it is provided that the modulator output signal of the digital delta-sigma modulator (to which the remaining bit locations were supplied) is suppliable to the signal pattern generator and that the modulation between the lower modulation variable and the upper modulation variable (by the signal pattern generator) is performed as a function of the modulator output signal. In a further development, a modulator clock signal, with which the digital delta-sigma modulator is operated and the modulator output signal output, corresponds to a signal pattern clock signal, with which individual signal patterns are output by the signal pattern generator. The signal pattern clock signal, in turn, is determined by the duration of a signal pattern, which results from the duration of one pulse and the signal pattern cycles total.

In a further development, the delta-sigma D/A converter includes an analog lowpass filter, by which a filtering of the output signal is performable. The lowpass filter provides an analog signal, whose value corresponds to the digital valued, input signal. The lowpass filter can be formed, for example, by an RC combination (resistance capacitor combination). In a further development, the delta-sigma D/A converter is embodied in an ASIC (application specific integrated circuit), a CPLD (complex programmable logic device), or an FPGA (field programmable gate array).

The case can occur, in which the output value range covered by the signal patterns of the set are not sufficient to cover the possible input value range of the digital input signal. In a further development, the delta-sigma D/A converter is embodied in such a manner that, for the case, in which an input value lies below the input value range covered by the signal patterns, the signal pattern with the lowest signal pattern average value of the set is issuable by the signal pattern generator. In a further development, the delta-sigma D/A converter is embodied in such a manner that for the case, in which the digital valued, input signal lies above the input value range covered by the signal patterns, the signal pattern with the highest signal pattern average value of the set is issuable by the signal pattern generator. In both cases, it is preferred that no modulation is performed by the delta-sigma modulator and the signal pattern in question output over so many iterations, until the input value lies back within the covered input value range.

As already explained above, there is especially need for an exact conversion with high linearity, when a digital valued, measured value or a digital valued, actuating value is to be converted into an analog voltage or current. This is, for example, the case, when a, measured value registered in a measuring device is present as a digital value and is to be transmitted as an analog electrical current via an analog current output of the measuring device to a corresponding receiver (for example, to a superordinated control device or to a measurement transmitter). Furthermore, this is the case, when an actuating value determined in a control device is present in the form of a digital value and is to be transmitted as an analog electrical current via an analog current output of the control device to a corresponding receiver, such as, for example, an actuator (e.g. a valve, pump, etc.). Accordingly, the present invention relates furthermore to the application of a delta-sigma D/A converter of the invention, which supplementally can also be embodied according to one or more of the above explained further developments and variants, in a device with an analog electrical current or voltage output for changing a digital valued, measured value determined by the device, or for changing a digital valued, actuating value determined by the device, into an analog electrical current- or voltage signal, which can be output via the analog electrical current- or voltage output. In such case, there can participate in the conversion also yet other (electronic) components, which especially process an analog signal issued by the delta-sigma D/A converter still more, before it is output via the analog electrical current- or voltage output. For example, the delta-sigma D/A converter can output an analog voltage and an electrical current control circuit and a corresponding control element can convert this into a corresponding electrical current value to be output via an analog electrical current output of the device. Especially, the device is a measuring device, by which an electrical current value (e.g. according to the 4-20 mA standard) corresponding to the measured value via an analog electrical current output of the measuring device. In such case, it can especially be a 2-conductor measuring device be, which is suppliable simultaneously with electrical power via a 2-conductor current loop, which is connected to the analog electrical current output.

The device can, in such case, have, besides the analog electrical current- or voltage output, also yet other inputs and/or outputs for the receiving and/or sending of signals. The device can especially be formed by a measuring device or a control device, as will be explained in further detail below. Furthermore, can the device also be formed by an actuator, which, for example, sets a feedback signal (especially one corresponding to an actuating value obtained from a control device) to the analog electrical current output. Furthermore, the device can be formed by a measurement transmitter, which, for example, obtains a measured value of a device as input signal, processes such and outputs a (processed) measured value back via the analog electrical current output. Entering into the processing performed in the measurement transmitter can be, in given cases, also measured values and/or actuating values of additional devices.

Widely used in industry is the transmission of measured values and actuating values via an electrical current loop. In such case, an electrical current set in the current loop corresponds to the respective value of the measured value, respectively actuating value, to be transmitted. Widely applied is the 4-20 mA standard (mA: milliampere), in the case of which, the measured value, or actuating value, to be transmitted corresponds, in each case, to electrical current values in the range from a lower electrical current limit value of 4 mA up to an upper electrical current limit value of 20 mA. In such case, however, also other limit values can be selected for the range, such as, for example, a lower electrical current limit value of 0 mA and an upper electrical current-limit value of 20 mA. In a further development, it is accordingly provided that the changing of the measured value or the actuating value (in the device) is made into an electrical current signal, especially into an electrical current signal according to the 4-20 mA standard. The electrical current signal can then be output via a corresponding analog electrical current output of the device.

The present invention relates, furthermore, to a measuring device with an analog electrical current- or voltage output, which has an delta-sigma D/A converter of the invention, which can also supplementally be embodied according to one or more of the above explained further developments and variants. In such case, the delta-sigma D/A converter is suppliable as digital valued input signal with a digital valued, measured value determined in the measuring device and the output signal of the delta-sigma D/A converter is used for producing an analog electrical current-, or voltage signal corresponding to the digital valued, measured value, so that such analog value can be output on the analog electrical current-, or voltage output. The (subsequently still filtered) output signal of the delta-sigma D/A converter is, in such case, especially processed further, before it is output via the analog electrical current- or voltage output. For example, after the filtering of the output signal of the delta-sigma D/A converter, an analog voltage can be obtained, which is converted by an electrical current control circuit and a control element then into an electrical current value to be output via the analog electrical current output.

The present invention relates, furthermore, to a control device with an analog electrical current, or voltage, output, which has a delta-sigma D/A converter of the invention, which can be embodied supplementally also according to one or more of the above explained further developments and variants. In such case, the delta-sigma D/A converter is suppliable, as digital valued input signal, with a digital valued, actuating value determined in the control device and the output signal of the delta-sigma D/A converter is for producing a analog electrical current, or voltage, signal corresponding to the digital valued, actuating value for output on the analog electrical current, or voltage, output. As explained above in reference to the measuring device, the (subsequently still filtered) output signal of the delta-sigma D/A converter can also be further processed, before it is output via the analog electrical current, or voltage, output.

The present invention relates, furthermore, to a method for operating a delta-sigma D/A converter, by which a digital valued, input signal is convertible in a binary output signal, which is clock signal time discrete, wherein the value (respectively, input value) of the input signal is analogy representable by an average value of the output signal formed over a number of clock cycles, characterized by steps as follows: providing the output signal by the delta-sigma D/A converter through serial arrangement of signal patterns of a set of signal patterns, wherein the signal patterns of the set are, in each case, binary, clock signal time discrete and extend via a signal pattern cycles total of a plurality of clock cycles, wherein at least two signal pattern of the set have signal pattern average values different from one another, which are formed via the particular signal pattern cycles total, and wherein all signal patterns of the set, in each case, have essentially the same number of edges, especially exactly the same number of edges. Through the method of the invention, the advantages explained above in reference to the delta-sigma D/A converter of the invention are achievable in corresponding manner. Furthermore, also the above explained variants and further developments are implementable in corresponding manner.

BRIEF DESCRIPTION OF THE DRAWINGS

Other advantages and utilities of the invention will become evident based on the following description of examples of embodiments with reference to the appended drawing, the figures of which show as follows.

DETAILED DISCUSSION IN CONJUNCTION WITH THE DRAWINGS

Figure 1A:
FIG. 1*a* to 1*d* are different signal curves of an output signal a conventional delta-sigma D/A converter.
Figure 1B:
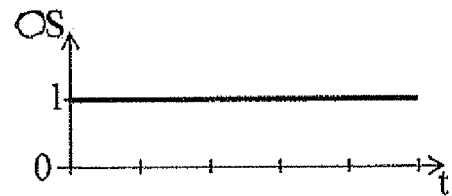
Figure 1C:
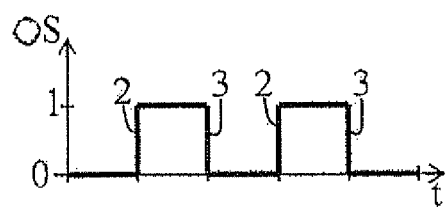
Figure 1D:
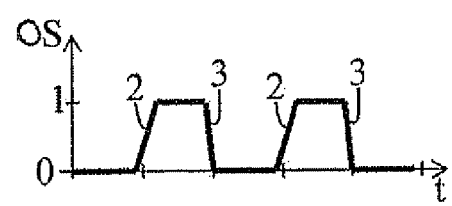
Figure 2:
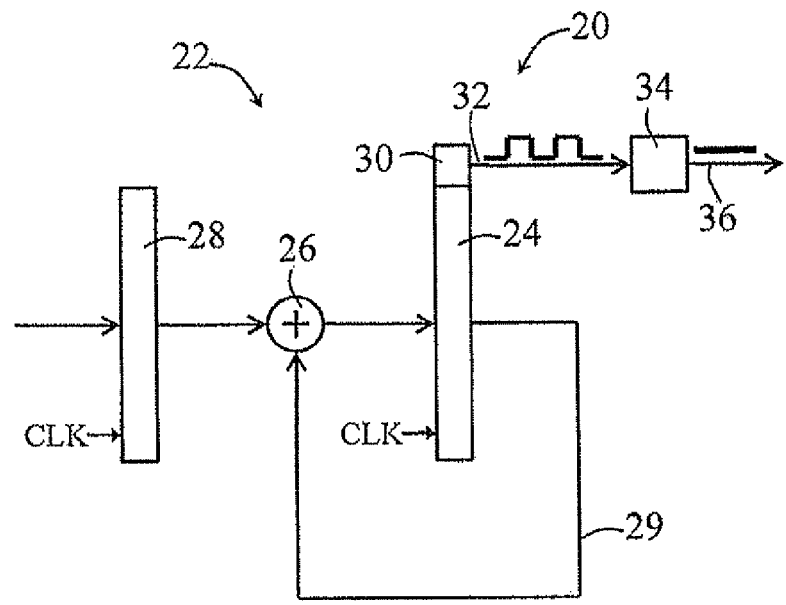
FIG. 2 is a schematic representation of operation of a conventional delta-sigma D/A converter of first order.

FIG. 2 shows the operation of a conventional delta-sigma D/A converter 20. The delta-sigma D/A converter 20 includes a delta-sigma modulator 22 formed as a digital circuit. The delta-sigma modulator 22, in turn, includes a register 24 with a register bit position count, which corresponds to the number of bit locations of the digital valued, input signal. In the case of the illustrated form of embodiment, involved is a 16-bit delta-sigma modulator 22, so that the digital valued, input signal 16 has bits. Furthermore, the delta-sigma modulator 22 includes a summation unit 26, which is fed, in accordance with a clock signal CLK, the digital valued, input signal, which is represented schematically in FIG. 2 by the box 28. Fed via a feedback loop 29 to the summation unit 26 in accordance with the clock signal CLK is, furthermore, the digital number contained in the register 24. The number obtained from the summation in the summation unit 26 is then written back into the register 24 in accordance with the clock signal CLK, wherein the number previously contained in the register is overwritten. Register 24 includes, in such case, a bit position count corresponding to the bit position count of the digital valued, input signal, here, thus, a bit position count of 16. Due to the summation performed in the summation unit 26, there can result also a bit position count, which is one higher, here, thus, a bit position count of 17. For this, an additional, overflow bit location 30 is provided, into which the highest valued bit of the sum is written in accordance with the clock signal CLK, in case the sum has a bit position count of 17. If the sum has, in contrast, only a bit position count corresponding to the bit position count of the digital valued, input signal, here, thus, 16 bit positions, then a "0" is written into the overflow bit location 30.

The (time-dependent, alternating in accordance with the clock signal CLK) occupation of the overflow bit location 30 forms at the same time the output signal of the delta-sigma D/A converter 20, which is output in accordance with the clock signal CLK. This is represented in FIG. 2 by the arrow 32 and the schematically indicated signal of the output signal. The output signal is a binary, clock signal CLK time discrete signal, wherein the two binary values acceptable for the output signal are referred to as "0" and as "1". In order to obtain an analog signal, the output signal is then filtered by an analog low-pass filter 34, which is formed here by an RC combination. After filtering, an analog signal, which is formed especially by an analog voltage value, is obtained. This is represented in FIG. 2 by the arrow 36 and the schematically indicated, analog signal.

As an example of operation, the case is considered, in which the digital value 1011 1111 1111 1111 is in the register 24 and the overflow bit location 30 has the value "0". In the next clock signal, an input value of 0111 1111 1111 1111 is added by the summation unit 26 to the value of 1011 1111 1111 1111 supplied from the register 24 via the feedback loop 29, so that next the value 0011 1111 1111 1110 is written into the register 24 and the value "1" into the overflow bit location 30. The value "1" of the overflow bit location 30 is, thus, output as output signal in this beat of the clock.

FIG. 2 was used to explain a 16-bit delta-sigma modulator. As known from the art, the 16-bit delta-sigma modulator requires a maximum of $2^{16}$, i.e. 65,536 clock cycles of the clock signal CLK, in order "to push out" an input value having 16 bit locations completely from the 16-bit delta-sigma modulator. The explained operation is analogous, in case the input signal has another bit position count n and the delta-sigma modulator correspondingly is formed by an n-bit delta-sigma modulator. In the latter case, the n-bit delta-sigma modulator requires a maximum of $2^n$ clock cycles, in order "to push out" an input value having n bit locations completely from the n-bit delta-sigma modulator.

Figure 3A:
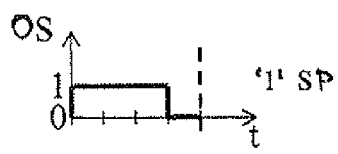
FIG. 3*a* and 3*b* are two different signal patterns forming a set of signal patterns according to a first form of embodiment of the present invention.
Figure 3B:
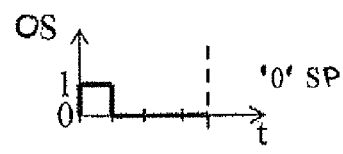

In a first form of embodiment of the present invention, the binary, clock signal time discrete, output signal is formed by serial arrangement of signal patterns of a set existing of a total of two different signal patterns. The two signal patterns, referred to as "1" SP and "0" SP, are shown in FIGS. 3a and 3b. In such case, in general, in FIGS. 3a-3e, FIGS. 4a-4c and FIG. 6, the respective signal forms of the signal patterns or, in given cases, of the output signal, which is referenced by OS, plotted as a function of time t. Indicated along the time axis t are the individual clock beats, in each case, by vertical tick marks. The two signal patterns "1" SP and "0" SP shown in FIGS. 3a and 3b are, in each case, binary and can assume over a clock cycle only one of two binary values referenced as "1" and "0". They have both a signal pattern cycles total of four. The signal pattern "1" SP shown in FIG. 3a assumes, in such case, the output value "1" over the first three clock cycles and over the fourth clock cycle the output value "0". Accordingly, this signal pattern "1" SP has over the four clock cycles, in which it is formed an average value of 075. In such case, it is to be taken into consideration that the specification of 0.75, or 75% is only a reference. Thus, the actual signal pattern average value, which can be formed, for example, by a voltage value, depends on the physical values (especially voltage values) actually output for the "1" and the "0". In the present context, the signal pattern average value is, however, referenced to the abstract binary values of "0" and "1". The signal pattern "0" SP shown in FIG. 3b assumes during the first clock cycle the output value "1" and during the clock cycles two to four the output value "0". Accordingly, this signal pattern "0" SP has a signal pattern average value of 0.25 formed over the four clock cycles.

Figure 3C:
FIG. 3*c* to 3*e* are different output signals formed from the signal patterns shown in FIGS. 3*a* and 3*b*.
Figure 3D:
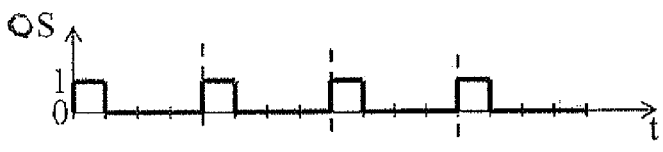
Figure 3E:

FIGS. 3c to 3e show, by way of example, different output signals formed by serial arrangement of the signal patterns "1" SP and "0" SP. The formed output signals are accordingly likewise binary and clock signal time discrete. The output signal shown in FIG. 3c is formed by alternating serial arrangement of the signal pattern "1" SP and "0" SP. An average value of the output signal formed over the shown duration amounts to 0.5. The output signal shown in FIG. 3d is formed by serial arrangement exclusively of the signal pattern "0" SP. An average value of the output signal formed over the shown duration amounts to 0.25. This is simultaneously the lowest output value representable by combination of the two signal patterns "0" SP and "1" SP. The output signal shown in FIG. 3e is formed by serial arrangement exclusively of the signal pattern "1" SP. An average value of the output signal formed over the shown duration amounts to 0.75. This is simultaneously the highest output value representable by combination of the two signal patterns "0" SP and "1" SP.

Figure 3F:
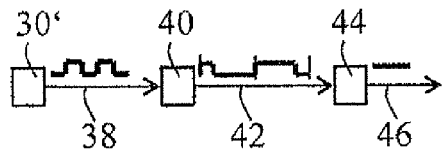
FIG. 3*f* is a schematic representation of producing the output signal according to a first form of embodiment.

In the case of the first form of embodiment, an n-bit delta-sigma modulator formed by a digital circuit and fed an input signal having n bit locations is operated in conventional manner, so that the n-bit delta-sigma modulator outputs a bit stream as modulator output signal. Especially, the n-bit delta-sigma modulator can be in the form of the 16-bit delta-sigma modulator 22 explained above with reference to FIG. 2. This example is shown schematically in FIG. 3f, in which the overflow bit location 30' of such a 16-bit delta-sigma modulator is represented. The output of the modulator output signal in the form of a bit stream from the 16-bit delta-sigma modulator is represented in FIG. 3f through the arrow 38 and the schematically indicated signal of the modulator output signal. This modulator output signal is fed to a signal pattern generator 40. The signal pattern generator 40 outputs the pattern referred to as "0" SP, when the modulator output signal assumes the value "0", and the pattern referred to as "1" SP, when the modulator output signal assumes the value "1". The determining of the pattern, in each case, to be output can be performed in the signal pattern generator 40 with the assistance of a lookup table. The output signal output by the signal pattern generator 40 is represented in FIG. 3f by the arrow 42 and the schematically indicated signal of the output signal. In the figure, the times indicated by the arrows 38 and 42 for the illustrated signals are not to scale relative to one another. The output signal from generator 40 is then fed to a low-pass filter 44, which performs a filtering and outputs an analog signal. The outputting of the analog signal is represented in FIG. 3f by the arrow 46 and the schematically indicated analog signal.

Because all signal patterns (here: "0" SP and "1" SP), in each case, have exactly one rising and exactly one falling edge and all signal patterns, in each case, have the same signal pattern cycles total, the number of edges over time and the frequency of the output signal (as considered over a multiplicity of the signal pattern cycles total) are constant and independent of the value represented in any instance. This is advantageous with reference to correcting error caused by distortion of edges as well as with reference to (analog) filtering of the output signal. If a corresponding delta-sigma D/A converter is used in a device with an analog electrical current, or voltage, output for converting a digital valued, measured value determined by the device, or for changing a digital valued, actuating value, as determined by the device, into an analog electrical current, or voltage, signal, then there is the further advantage that the electrical current, or voltage, value, due to the forming of the signal pattern, cannot decrease completely to zero.

Since in the case of the first form of embodiment, in each case, 4 clock cycles are required for output of a signal pattern, the associated delta-sigma modulator (here: the 16-bit delta-sigma modulator) is operated with a modulator clock signal, which corresponds to a signal pattern clock signal, with which individual signal patterns are output by the signal pattern generator 40. Here, the modulator clock signal frequency (as well as the signal pattern clock signal frequency) corresponds to a fourth of the clocking frequency. Correspondingly, as was explained above, the 16-bit delta-sigma modulator requires a maximum of $2^{16}$, i.e. 65,536 modulator clock signal cycles, in order "to push out" an input value having 16 bit locations completely from the 16-bit delta-sigma modulator. Since for the output of a modulator output value, in turn, 4 clock cycles are required (for producing the associated signal pattern), in the case of the first form of embodiment, a maximum of $2^{18}$, i.e. 262,144 clock cycles are required, in order "to push out" a input value having 16 bit positions completely from the delta-sigma D/A converter. Furthermore, in the case of this form of embodiment, it is to be noted that the lower limit value of the allowable input value range is "mapped" to an averaged output value of 0.25 (lowest, representable, averaged output value) and the upper limit value of the allowable input value range to an averaged output value of 0.75 (highest, representable, averaged output value). There occurs, thus, a scaling of the allowable input value range (of 0000 0000 0000 0000 to 1111 1111 1111 1111) to the reduced, averaged output value range (of 0.25 to 0.75). This scaling is to be taken into consideration in the additional processing, respectively evaluation, of the output signal.

Figure 4A:
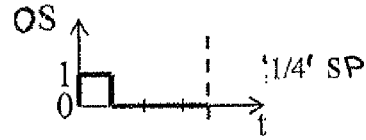
FIG. 4*a* to 4*c* three different signal patterns forming a set of signal patterns according to a second form of embodiment of the present invention.
Figure 4B:
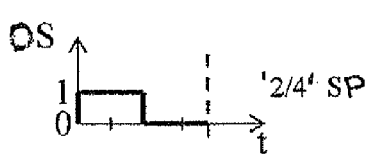
Figure 4C:

A second form of embodiment of the present invention will now be presented, as illustrated in FIGS. 4a to 4c. In such case, primarily differences relative to the first form of embodiment will be explored. In the second form of embodiment, the binary, clock signal time discrete, output signal is formed by serial arrangement of signal patterns of a set of a total of three different signal patterns. These three signal patterns are represented in FIGS. 4a to 4c. The three signal pattern, referred to, respectively, as "1/4" SP (compare FIG. 4a), "2/4" SP (compare FIG. 4b) and "3/4" SP (compare FIG. 4c), have each a signal pattern cycles total of 4. The signal of the "1/4" SP signal pattern corresponds to the signal pattern the first form of embodiment referred to as "0" SP and the signal of the "3/4" SP signal pattern corresponds to that referred to as "1" SP. The signal pattern referred to as "2/4" SP assumes during the first two clock signal cycles the output value "1" and during the third and fourth clock signal cycles the output value "0". Accordingly, this signal pattern "2/4" SP has, formed over the four clock signal cycles, a signal pattern average value of 0.5. As a result, the output value range of 0.25 to 0.75 can be divided into subranges of 0.25 to 0.5 and 0.5 to 0.75. Averaged output values between 0.25 and 0.5 can, thus, be represented by modulation of the signal pattern referenced as "1/4" SP and "2/4" SP and averaged output values between 0.5 and 0.75 by modulation of the signal patterns referenced as "2/4" SP and "3/4" SP. In order, in the case of a concrete input value, to determine, between which two signal patterns a modulation is to be performed, according to the second form of embodiment, so many of the highest valued bit locations of the input signal are diverted, as are required for counting through the different signal patterns of the set. In the present instance, since the set has three different signal patterns, this means two bit locations. Accordingly, an association can be defined, by which the signal pattern "1/4" SP is associated with an occupation of "01" of the first two bit locations, the signal pattern "2/4" SP an occupation of "10" of the first two bit locations and the signal pattern "3/4" SP an occupation of 11 of the first two bit locations of the input signal. In the case of this association, the input value range of 0000 0000 0000 0000 to 0011 1111 1111 1111 and the input value range of 1100 0000 0000 0001 to 1111 1111 1111 1111 are not displayable by the affected delta-sigma D/A converter.

Production of the output signal according to the second form of embodiment will now be briefly described. A more detailed description of the production of the output signal is given with reference to FIG. 5 for explanation of the third form of embodiment, in the case of which the signal patterns, in each case, have a signal pattern cycles total of 16. In the case of the second form of embodiment, within the representable input value range, it is determined by a signal pattern generator, based on the first two bit locations (e.g. with application of a corresponding lookup table), which the (according to the association) associated signal pattern is and this is used as the lower modulation variable. If, for example, the first two bit locations are 01, then the signal pattern "1/4" is used as the lower modulation variable. The signal pattern with the next higher signal pattern average value is then used as the upper modulation variable. In the case of the present example, this would then be the signal pattern "2/4". The (after the diverting) remaining bit locations of the input signal are fed to an n-bit delta-sigma modulator, wherein n corresponds to the number of remaining bit locations. Here, the delta-sigma modulator is embodied as a 14-bit delta-sigma modulator. The modulator output signal of the 14-bit delta-sigma modulator is then sent to the signal pattern generator. As a function of the numbers occupying the remaining bit locations of the input signal modulated in the sigma delta-modulator, the modulator output signal output in a modulator clock cycle exhibits a corresponding relationship of "0"s and "1"s. The modulator clock signal frequency corresponds in the present case to one fourth of the clocking frequency, since, in each case, four clock signal cycles are required for output of a signal pattern by the signal pattern generator. When the modulator output signal has the value "0", the signal pattern generator outputs the lower modulation variable and when the modulator output signal has the value "1", the upper modulation variable is output. In this way, the particular input value is represented by modulation of the corresponding two signal patterns.

As is clear based on the above explanations, in the case of the delta-sigma D/A converter according to the second form of embodiment, essentially only a range of 25% to 75% of the input value range representable by 16 bit locations is possible. This input value range is thus mapped onto an output value range of 0.25 to 0.75. This is to be taken into consideration in the case of, in given cases, performed preprocessing of the input signal and in the case of the additional processing of the output signal. Especially, the input signal can be correspondingly matched to this allowable input value range. The fact that only a portion of the input value range representable by 16 bit locations is displayable, is especially relatively without problem in the case of application of the delta-sigma D/A converter for producing an electrical current signal according to the 4-20 mA standard, since here, for example, the lower range of 0 mA to just before 4 mA need not, as a rule, be represented anyway.

The second form of embodiment especially provides the following, additional advantages: Because, according to the second form of embodiment, two bit locations of the input signal are diverted and only the remaining bit locations be modulated by a delta-sigma modulator, the delta-sigma modulator can be embodied with less bit locations. Accordingly, fewer resources are required for providing the delta-sigma modulator. Furthermore, the delta-sigma modulator can be operated with a lower modulator clock signal frequency, and this leads to reduced energy consumption. Furthermore, it is advantageous that because the first two, highest valued bit locations are supplied directly to the signal pattern generator, the output signal output by the signal pattern generator can follow major changes of the input signal rapidly.

Figure 6:
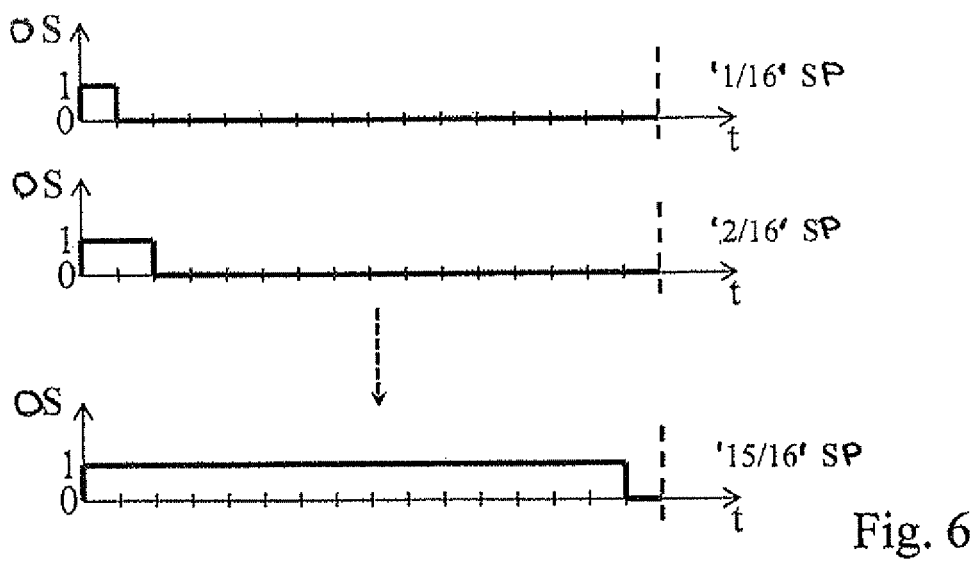
FIG. 6 is a representation of the construction of fifteen different signal patterns forming a set of signal patterns according to the third form of embodiment of the present invention.

These advantages explained with reference to the second form of embodiment are developed further in the case of the third form of embodiment, in the case of which the individual signal patterns of the set have, in each case, a signal pattern cycles total of 16. In the following explanation of the third form of embodiment, primarily differences relative to the second form of embodiment will be explored. The set of signal patterns in the case of the third form of embodiment contains fifteen different signal patterns, each of which has a signal pattern cycles total of 16. The construction of these signal patterns is shown in FIG. 6. The signal pattern with the lowest signal pattern average value, which is referred to as "1/16" SP, assumes over the first clock signal cycle the beginning value of "1" and from the second to the sixteenth clock signal cycle the output value of "0". The signal pattern "1/16" SP has an average value of 1/16 formed over the sixteen clock signal cycles. The signal pattern with the next higher signal pattern average value, which is referred to as "2/16" SP, assumes relative to the signal pattern "1/16" SP over exactly one clock signal cycle more, namely from the first through the second clock signal cycle, the output value "1". The signal pattern "2/16" SP has an average value of 2/16 formed over the sixteen clock signal cycles. This schema continues, wherein each signal pattern of the set assumes, relative to the signal pattern with the next lower signal pattern average value, for exactly one clock signal longer, the output value "1". The signal pattern with the highest signal pattern average value is the bottom signal pattern "15/16" SP in FIG. 6, which assumes from the first through the fifteenth clock signal cycle the output value "1" and in the sixteenth clock signal cycle the output value "0". The signal pattern "15/16" has, thus, an average value of 15116 formed over the sixteen clock signals of the signal pattern. In this way, the output value range of 1/16 to 15/16 can be divided into 14 subregions, each of which has a width of 1/16. Averaged output values between 1/16 and 2/16 can be represented, for example, by a modulation of the signal patterns referenced as "1/16" SP and "2/16" SP. Again, as in the case of the second form of embodiment, so many of the highest valued bit locations of the input signal are diverted, as are required for counting through the different signal patterns. In this case, since the set has fifteen different signal patterns, this means four bit locations. Furthermore, in turn, an association is defined, by which in the present case the signal pattern "1/16" SP receives an occupation of 0001, the signal pattern "2/16" SP an occupation of 0010, etc., the signal pattern "8/16" SP an occupation of 1000, etc. and the signal pattern "15/16" an occupation of 1111. Accordingly, the input value range of 0000 0000 0000 0000 to 0000 1111 1111 1111 and the input value range of 1111 0000 0000 0001 to 1111 1111 1111 1111 are not displayable by the delta-sigma D/A converter. The non-presentable input value range, which includes essentially the ranges of 0 to 1/16 and 15/16 to 16/16, is markedly reduce relative to the second form of embodiment.

Figure 5:
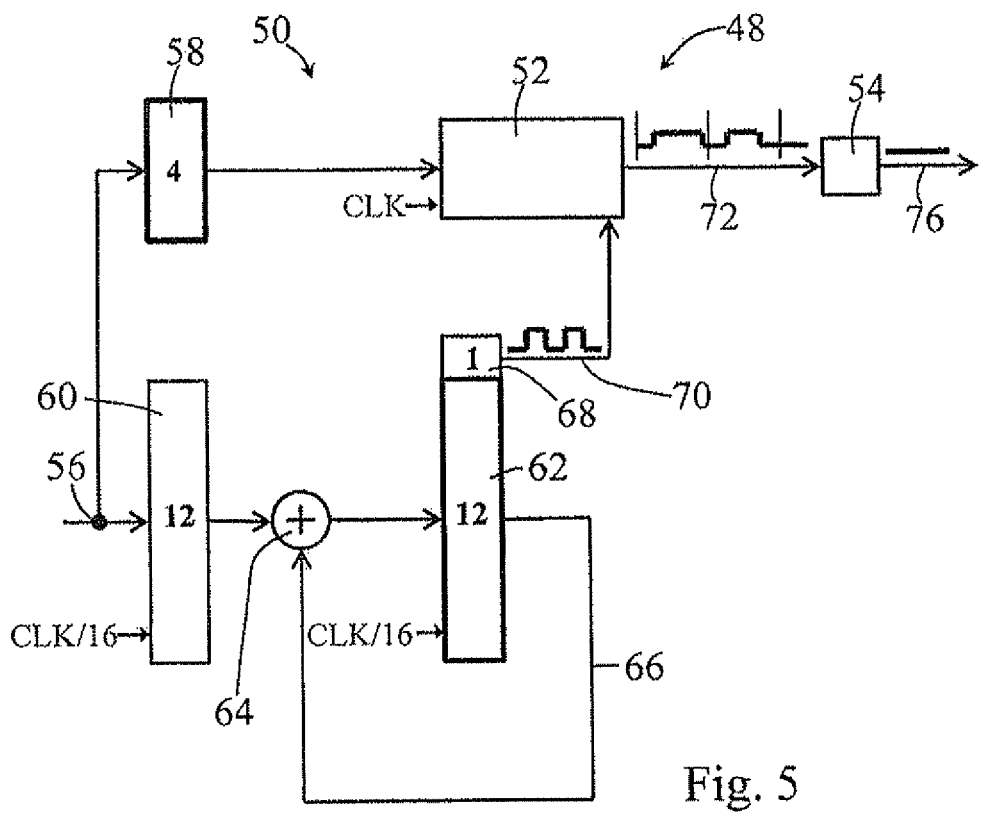
FIG. 5: is a schematic representation of operation of a delta-sigma D/A converter of the invention according to a third form of embodiment of the present invention.

Production of the output signal according to the third form of embodiment will now be described with reference to FIG. 5. The input signal having 16 bit locations, after the diverting of the first four bit locations, retains 12 bit locations, so that a 12-bit delta-sigma D/A converter is to be provided for modulating the remaining bit locations. The delta-sigma D/A converter 48 shown in FIG. 5 includes a 12-bit delta-sigma modulator 50 in the form of a digital circuit, a signal pattern generator 52 and an analog lowpass filter 54. The first four (i.e. the four highest valued) bit locations are first diverted from the input signal fed to the delta-sigma D/A converter 48. This is shown in FIG. 5 schematically by the junction 56 representing the diversion of the four bit locations block 58 of the input signal, such that a twelve bit locations block 60 of the input signal remains. The first four, diverted bit locations are fed directly to the signal pattern generator 52. As a function of the occupation of the diverted (first four) bit locations, the signal pattern generator 52 determines the associated signal pattern (especially with application of a lookup table). This is then used as the lower modulation variable in the signal pattern generator 52. If the first four bit locations are, for example, 1000, then the signal pattern "8/16" SP is used as the lower modulation variable. The signal pattern with the next higher signal pattern average value is then used as the upper modulation variable. In the case of the present example, this would then be the signal pattern "9/16" SP.

The (after the diverting) remaining bit locations of the input signal are fed to the 12-bit delta-sigma modulator 50. The delta-sigma modulator 50 is operated as described for the delta-sigma modulator 22 explained with reference to FIG. 2. The modulator clock frequency of the 12-bit delta-sigma modulator corresponds to the signal pattern clock frequency, with which the individual, 16 clock signal cycles long, signal patterns are output from the signal pattern generator 52. The modulator clock signal frequency corresponds in the present example accordingly to 1/16 of the clocking frequency. In this way, the consumption of electrical power can (in comparison to the second form of embodiment) be still further reduced. Furthermore, it is advantageous that only a 12-bit delta-sigma modulator 50 (in the comparison to a 14-bit delta-sigma modulator in the case of the second form of embodiment) is required, so that, also here, resources are saved. The 12-bit delta-sigma modulator 50 includes, same as the delta-sigma modulator 22 FIG. 2, a register 62 with a bit position count of twelve, a summation-unit 64, a feedback loop 66 and an overflow bit location 68. To the summation unit 64 are fed with each modulator clock signal beat CLK/16 the remaining (twelve) bit locations of the input signal and the digital number contained in the register 62 (of twelve bit locations). The digital number obtained from the summation in the summation unit 64 is then written into the register 62 according to the modulator clock signal CLK/16, wherein the number previously contained in the register 62 is over-written. Correspondingly, as in the case of the delta-sigma modulator 22 of FIG. 2, when the obtained sum has a bit position count of 13 with a "1" at the highest valued bit, a "1" is written into the overflow bit location 68. If the obtained sum has a bit location count of 12, then a "0" is written into the overflow bit location 68.

The (time-dependent, changing as governed by the modulator clock signal CLK/16) occupation of the overflow bit location 68 forms at the same time the modulator output signal of the 12-bit delta-sigma modulator 50, which is output in accordance with the modulator clock signal CLK/16. This is shown in FIG. 5 by the arrow 70 and the schematically indicated signal of the modulator output signal. The modulator output signal is a binary, modulator clock signal CLK/16 time discrete signal. It fulfills, in such case, the relationship that its average value (formed over a number of modulator clock cycles) corresponds to the value of the remaining (twelve) bit locations, which are fed to the 12-bit delta-sigma modulator. The modulator output signal is fed to the signal pattern generator 52. The signal pattern clock signal of the signal pattern generator 52, with which the individual signal patterns are output, is, in such case, matched to the modulator clock signal of the 12-bit delta-sigma modulator 50. The signal pattern generator 52, based on the modulator output signal, performs the modulation between the lower modulation variable and the upper modulation variable (wherein the determining of the lower and the upper modulation variables occurs, as above explained, based on the first four, diverted bit locations). Especially, the signal pattern generator 52 outputs the lower modulations variable, when the modulator output signal has the value "0", and the upper modulation variable, when the modulator output signal has the value "1". In this way, the input value of the input signal is represented by modulation of the corresponding two signal patterns. The output signal, which is formed by serial arrangement of the respectively determined signal patterns, is a binary, clock signal CLK time discrete signal, whose average value (formed over a number of clock cycles, especially over a plurality of the signal pattern clock cycles total) corresponds to the input value of the input signal. The output of the output signal from the signal pattern generator 52 is represented in FIG. 5 by the arrow 72 and the schematically indicated signal of the output signal. In the figure, the times indicated by the arrows 70 and 72 for the illustrated signals are not to scale relative to one another. In order to obtain an analog (continuous) signal, the output signal is then filtered by the analog, low-pass filter 54. If the signal is to be transmitted through a galvanic isolation, then preferably the output signal is transmitted through the galvanic isolation before performing the filtering and then the filtering performed thereafter. The filtering leads to an analog signal, which is especially in the form of an analog voltage value. This is shown in FIG. 5 by the arrow 76 and the schematically indicated, analog signal.

A further advantage, which is achieved by the third form of embodiment compared to the first form of embodiment, is that the required number of clock cycles, in order to push out an input value having 16 bit locations completely from the delta-sigma D/A converter 48. The 12-bit delta-sigma modulator 50 requires $2^{12}$, i.e. 4,096 modulator clock cycles, in order completely "to push out" the twelve bit locations remaining from the respective input value. Since, for the output of a modulator output value, in turn, 16, i.e. $2^4$ clock cycles are required, then, as a whole, $2^{16}$, i.e. 65,536 clock cycles, for are required for pushing out an input value having 16 bit locations. The means that there is no expansion, respectively slowing, compared with a conventional 16-bit delta-sigma modulator, such as was the case, for example, with reference to FIG. 2. This number of $2^{16}$ clock cycles is also that which is required in the case of the second example of an embodiment ($2^2$ times $2^{14}$ clock cycles). Compared to the second form of embodiment, however, as above explained, the representable input value range is markedly increased. Furthermore, compared with the second form of embodiment, the delta-sigma modulator here can have a lower bit position count.

Figure 7:
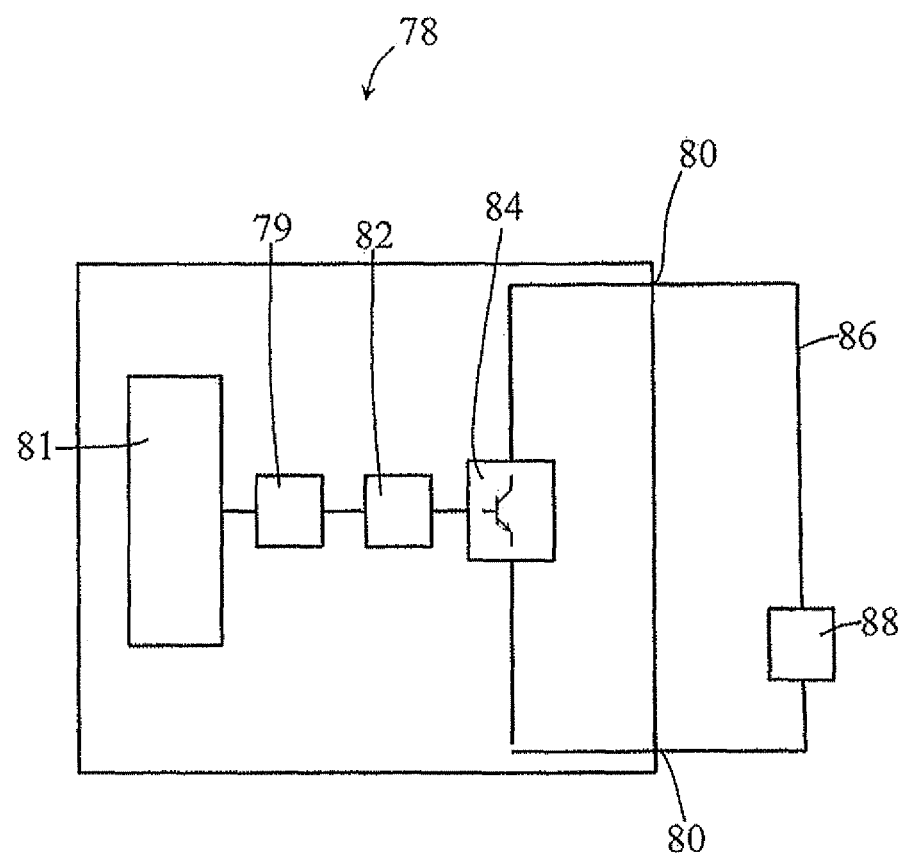
FIG. 7: is a schematic representation of a measuring device for illustrating an application of the delta-sigma D/A converter of the invention.

Now, with reference to FIG. 7, by way of example, an application of a delta-sigma D/A converter 79 of the invention in a measuring device 78, wherein an analog electrical current signal according to the 4-20 mA standard for transmission of a measured value registered in the measuring device 78 is issuable via an analog electrical current output 80 of the measuring device 78, will be explained. In such case, FIG. 7 shows only the components essential for explanation of the invention. Measuring device 78 includes a control unit 81, which outputs as a digital valued signal the measured value to be transmitted. This digital valued signal forms the input signal of the delta-sigma D/A converter 79 of the invention. As explained above, the input signal is to be converted into an analog signal, here, a voltage signal, which corresponds to an electrical current value to be set on the analog electrical current output 80. Corresponding to this voltage signal, in an electrical current control circuit 82, which, in given cases, also receives feedback of an electrical current value actually set on the analog electrical current output 80, an actuating variable is formed for output to a control element 84 (here: a transistor). The control element 84 then correspondingly the manipulated variable sets an electrical current value in an electrical current loop 86 connected to the analog electrical current output 80. In this way, the measured value registered in the measuring device 78 can be transmitted to a receiver 88, such as, for example, a control device, connected to the current loop 86.

The present invention is not limited to the examples of embodiments explained with respect to the figures. Especially, it can be provided that the input signal has also more or less than 16 bit locations. Furthermore, for example, also the relationship between diverted and remaining bit locations of the input signal can be selected in other ways.

The invention claimed is:
1. A delta-sigma D/A converter, by which a digital valued, input signal is convertible into a binary, clock signal time discrete, output signal, wherein:
   by forming an average value of the output signal over a number of clock signal cycles, an analog value of the input signal can be displayed;
   the delta-sigma D/A converter is embodied in such a manner that, in use, it provides the output signal by serial arrangement of signal patterns of a set of signal patterns;
   said signal patterns of the set are, in each case, binary, clock signal time discrete and extend over a signal pattern cycles total of a plurality of clock cycles;
   at least two signal patterns of the set have mutually different, signal pattern average values, which are formed over the respective signal pattern cycles total; and
   all signal patterns of the set have, in each case, the same number of edges;
   wherein all signal patterns of the set have, in each case, exactly one rising edge and exactly one falling edge.
2. The delta-sigma D/A converter as claimed in claim 1, wherein:
   all signal patterns of the set have, in each case, the same number of rising edges and, in each case, the same number of falling edges.
3. The delta-sigma D/A converter as claimed in claim 1, wherein:
   all signal patterns of the set have, in each case, the same signal pattern cycles total.
4. The delta-sigma D/A converter as claimed in claim 1, wherein:
   all signal patterns of the set have, in each case, different signal pattern average values.
5. The delta-sigma D/A converter as claimed in claim 1, wherein:
   all signal patterns of the set have a signal pattern cycles total of m cycles; the set has m-1 different signal patterns with, in each case, different signal pattern average values, the signal pattern with the lowest signal pattern average value assumes for exactly one clock signal cycle the high value of the two binary values and for the remaining m-1 clock signal cycles the low binary value; and
   each signal pattern of the set assumes, relative to the signal pattern with the next lower signal pattern average value, the high binary value for exactly one clock signal longer.
6. The delta-sigma D/A converter as claimed in claim 1, wherein:
   the delta-sigma D/A converter has a digital delta-sigma modulator, by which at least one part of the digital valued, input signal is modulatable.
7. The delta-sigma D/A converter as claimed in claim 6, wherein:
   the delta-sigma D/A converter is embodied in such a manner that from the digital valued, input signal a predetermined number of places of the highest valued bit locations are divertable and the remaining bit locations are suppliable to said digital delta-sigma modulator for producing a binary, modulator clock signal time discrete, modulator output signal.
8. The delta-sigma D/A converter as claimed in claim 7, wherein:
   an association is defined, by which there is associated with each signal pattern of the set, in each case, an occupation of the divertable, highest valued bit location(s) of the digital valued, input signal;
   the occupation corresponds to the signal pattern average value of the signal pattern;
   the delta-sigma D/A converter has a signal pattern generator, by which, as a function of the respective occupations of the diverted, highest valued bit location(s) corresponding to the association, the associated signal pattern is determinable, and that this determined signal pattern is issuable by said signal pattern generator as lower modulation variable for forming the output signal.

9. The delta-sigma D/A converter as claimed in claim 8, wherein:
the signal pattern with the next higher signal pattern average value in comparison to the signal pattern average value of the signal pattern determined as the lower modulation variable by the signal pattern generator is issuable as the upper modulation variable for forming the output signal.

10. The delta-sigma D/A converter as claimed in claim 9, wherein:
said modulator output signal of said digital delta-sigma modulator is suppliable to said signal pattern generator and the modulation between the lower modulation variable and the upper modulation variable is performed as a function of the modulator output signal.

11. The use of a delta-sigma D/A converter by which a digital valued, input signal is convertible into a binary, clock signal time discrete, output signal, wherein: by forming an average value of the output signal over a number of clock signal cycles, an analog value of the input signal can be displayed; the delta-sigma D/A converter is embodied in such a manner that, in use, it provides the output signal by serial arrangement of signal patterns of a set of signal patterns; said signal patterns of the set are, in each case, binary, clock signal time discrete and extend over a signal pattern cycles total of a plurality of clock cycles; at least two signal patterns of the set have mutually different, signal pattern average values, which are formed over the respective signal pattern cycles total; and all signal patterns of the set have, in each case, the same number of edges, wherein:
the device having an analog electrical current, or voltage, output for converting a digital valued, measured value determined by said device, or for converting a digital valued, actuating value determined by said device, into an analog electrical current, or voltage, signal, is issuable via the analog electrical current, or voltage, output.

12. The use as claimed in claim 11, wherein:
the converting of the measured value or of the actuating value occurs into an electrical current signal, especially into an electrical current signal according to the 4-20 mA standard.

13. A measuring device having an analog electrical current, or voltage, output and a delta-sigma D/A converter, by which a digital valued, input signal is convertible into a binary, clock signal time discrete, output signal, wherein: by forming an average value of the output signal over a number of clock signal cycles, an analog value of the input signal can be displayed; the delta-sigma D/A converter is embodied in such a manner that, in use, it provides the output signal by serial arrangement of signal patterns of a set of signal patterns; said signal patterns of the set are, in each case, binary, clock signal time discrete and extend over a signal pattern cycles total of a plurality of clock cycles; at least two signal patterns of the set have mutually different, signal pattern average values, which are formed over the respective signal pattern cycles total; and all signal patterns of the set have, in each case, the same number of edges, wherein:
the delta-sigma D/A converter is suppliable as a digital valued, input signal with a digital valued, measured value determined in said measuring device, and the output signal of the delta-sigma D/A converter is issuable for producing on the analog electrical current, or voltage, output an analog electrical current, or voltage, signal corresponding to the digital valued, measured value.

14. A control device having an analog electrical current, or voltage, output and a delta-sigma D/A converter, by which a digital valued, input signal is convertible into a binary, clock signal time discrete, output signal, wherein: by forming an average value of the output signal over a number of clock signal cycles, an analog value of the input signal can be displayed; the delta-sigma D/A converter is embodied in such a manner that, in use, it provides the output signal by serial arrangement of signal patterns of a set of signal patterns; said signal patterns of the set are, in each case, binary, clock signal time discrete and extend over a signal pattern cycles total of a plurality of clock cycles; at least two signal patterns of the set have mutually different, signal pattern average values, which are formed over the respective signal pattern cycles total; and all signal patterns of the set have, in each case, the same number of edges, wherein:
the delta-sigma D/A converter is suppliable as digital valued, input signal with a digital valued, actuating value determined in the control device, and the output signal of the delta-sigma D/A converter is issuable for producing on the analog electrical current, or voltage, output an analog electrical current, or voltage, signal corresponding to the digital valued, actuating value.

* * * * *